(12) United States Patent
Ho (10) Patent No.: US 10,001,707 B2
(45) Date of Patent: Jun. 19, 2018

(54) EXPOSURE METHOD, EXPOSURE EQUIPMENT AND 3-D STRUCTURE

(71) Applicant: Winbond Electronics Corp., Taichung (TW)

(72) Inventor: Yu-Hsuan Ho, Taoyuan (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days. days.

(21) Appl. No.: 15/296,335

(22) Filed: Oct. 18, 2016

(65) Prior Publication Data

US 2017/0293226 A1 Oct. 12, 2017

(30) Foreign Application Priority Data

Apr. 8, 2016 (CN) .......................... 2016 1 0214904

(51) Int. Cl.
*G03F 7/20* (2006.01)

(52) U.S. Cl.
CPC .......... *G03F 7/2035* (2013.01); *G03F 7/2022* (2013.01); *G03F 7/2051* (2013.01); *G03F 7/2053* (2013.01); *G03F 7/70383* (2013.01); *G03F 7/70416* (2013.01)

(58) Field of Classification Search
CPC ...... G03F 7/2051; G03F 7/2053; G03F 7/704; G03F 7/70416; G03F 7/70383; G03F 7/2002; G03F 7/2012; G03F 7/2022

USPC ................................... 430/18, 322, 325, 394
See application file for complete search history.

(56) References Cited

U.S. PATENT DOCUMENTS

2003/0082487 A1* 5/2003 Burgess ................ G03F 7/0037
430/15

FOREIGN PATENT DOCUMENTS

| CN | 103896484 A | | 7/2014 |
|---|---|---|---|
| JP | 07-106229 A | * | 4/1998 |
| JP | 2015085626 A | | 5/2015 |

OTHER PUBLICATIONS

Computer-generated translation of JP 07-106229 (Apr. 1998).*

* cited by examiner

*Primary Examiner* — John A McPherson
(74) *Attorney, Agent, or Firm* — Muncy, Geissler, Olds & Lowe, P.C.

(57) ABSTRACT

An exposure method is provided. The exposure method includes coating a photo-curable material on a substrate, and exposing a portion of the photo-curable material by providing a first light source through an optical fiber to form a first photo-cured material. The optical fiber includes a light output end and a cone portion that tapers toward the light output end. The photo-curable material not exposed by the first light source is removed while leaving the first photo-cured material. Exposure equipment for performing the exposure method and a 3-dimensional structure formed thereby are also described.

11 Claims, 8 Drawing Sheets

EXPOSURE METHOD, EXPOSURE EQUIPMENT AND 3-D STRUCTURE

CROSS REFERENCE TO RELATED APPLICATIONS

This Application claims priority of Chinese Patent Application No. 201610214904.3, filed on Apr. 8, 2016 and entitled "EXPOSURE METHOD, EXPOSURE EQUIPMENT AND 3-D STRUCTURE", and the entirety of which is incorporated by reference herein.

BACKGROUND

Field of the Disclosure

The present disclosure relates to a 3-dimensional printing technology, and in particular it relates to an exposure method, exposure equipment, and a 3-dimensional structure.

Description of the Related Art

Today's 3-dimensional (3-D) printing technology has attracted wide attention from the design industry and the manufacturing industry because of its low cost and simple process. However, the critical dimensions of the resulting 3-dimensional structure are limited to tens of micrometers due to the technical capacity of the manufacturing equipment. This is disadvantageous when manufacturing small and fine products.

For example, for a 3-dimensional structure manufactured by an ink jet printing process, the critical dimensions of the final structure are limited by the ink droplet size. Furthermore, for a 3-dimensional structure manufactured by a selective laser sintering process or a selective laser melting process, the critical dimensions of the final structure is limited by the beam size of the light source. Because the critical dimensions cannot be reduced any further, the application of 3-D printing technology in micro electromechanical systems (MEMS) and printed electronics is limited. Therefore, an improved 3-D printing technology with smaller critical dimensions is desirable.

BRIEF SUMMARY

The disclosure provides an exposure method. The exposure method includes coating a photo-curable material on a substrate, and exposing a portion of the photo-curable material by providing a first light source through an optical fiber to form a first photo-cured material. The optical fiber includes a light output end and a cone portion that tapers toward the light output end. The exposure method also includes removing photo-curable material not exposed by the first light source while leaving the first photo-cured material.

The disclosure also provides exposure equipment. The exposure equipment includes a carrier platform for placing photo-curable material, a light source module comprising an optical fiber, and a control module for controlling the motion of the optical fiber. The optical fiber includes a light output end and a cone portion that tapers toward the light output end. The optical fiber is configured to provide a light source for performing an exposure step on the photo-curable material.

The disclosure also provides a 3-dimensional structure. The 3-dimensional structure includes a substrate and a photo-cured structure formed on the substrate. The photo-cured structure has a height in a direction that is perpendicular to the top surface of the substrate, and the height is in a range of 10-1000 µm. The photo-cured structure has a width and a length in a direction that is parallel to the top surface of the substrate, and at least one of the width and the length is in a range of 1-100 nm.

A detailed description is given in the following embodiments with reference to the accompanying drawings.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

The present disclosure is best understood from the following detailed description when read with the accompanying figures. It should be noted that, in accordance with the standard practice in the industry, various features are not drawn to scale. In fact, the relative dimensions of the various features may be arbitrarily increased or reduced for clarity of discussion. In addition, the present disclosure may repeat reference numerals and/or letters in the various examples. This repetition is for the purpose of simplicity and clarity and does not in itself dictate a relationship between the various embodiments and/or configurations discussed.

Figure 1:
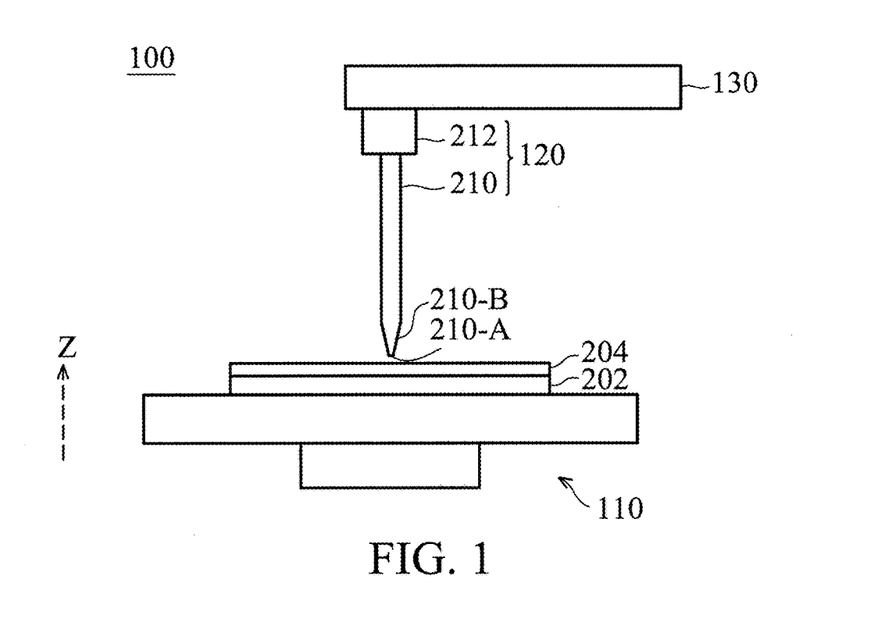
FIG. 1 shows a cross-sectional view of exposure equipment in accordance with some embodiments.

FIG. 1 shows a cross-sectional view of exposure equipment 100 in accordance with some embodiments. Referring to FIG. 1, the exposure equipment 100 includes a carrier platform 110, a light source module 120, and a control module 130. The carrier platform 110 is used for placing a substrate 202. In some embodiments, the substrate 202 is affixed to the carrier platform 110 by a vacuum system (not shown) of the carrier platform 110. Then a material that will be exposed, such as a photo-curable material 204, is coated on the substrate 202. In some embodiments, the carrier platform 110 is configured to control the motion of the substrate 202 in the Z direction. In other words, the distance between the photo-curable material 204 and the light source module 120 can be controlled using the carrier platform 110.

The light source module 120 includes a light source generator 212 and an optical fiber 210. The light source module 120 is configured to provide the exposing light source for curing the photo-curable material 204. The exposing light source may include UV light. The wavelength λ of the exposing light source may be 100-450 nm. In some embodiments, the wavelength λ of the exposing light source may be 100-400 nm. In other embodiments, the wavelength λ of the exposing light source may be 200-400 nm. The exposing light source may be line source or a laser.

Still referring to FIG. 1, the optical fiber 210 includes a light output end 210-A and a cone portion 210-B that tapers toward the light output end 210-A. In the exposure step, the optical fiber 210 is configured to transmit the exposing light source emitted from the light source generator 212 to the photo-curable material 204. Optical fiber 210 has a cone portion 210-B, and therefore the light output area of the light output end 210-A may be significantly reduced compared to that of an optical fiber without a cone portion. Thus, the critical dimensions of the resulting 3-dimensional structure may be significantly reduced. The details are discussed in the following paragraphs.

In order to perform localized exposure of the photo-curable material 204, the control module 130 is configured to control the motion of the optical fiber 210 in the X direction, Y direction, and Z direction. In particular, by controlling the motion of the optical fiber 210 in the Z direction, the beam size of the exposing light source may be controlled with the control module 130. It is helpful to reduce the critical dimensions of the resulting 3-dimensional structure. In some embodiments, the control module 130 may use, for example, the control module of an atomic force microscope (AFM). The control module of an AFM usually includes a piezoelectric ceramic scanner, a cantilever, offset detectors, scanners, a feedback circuit, and a computer control system. In order to simplify the drawings, only the cantilever is depicted schematically.

Figure 2A:
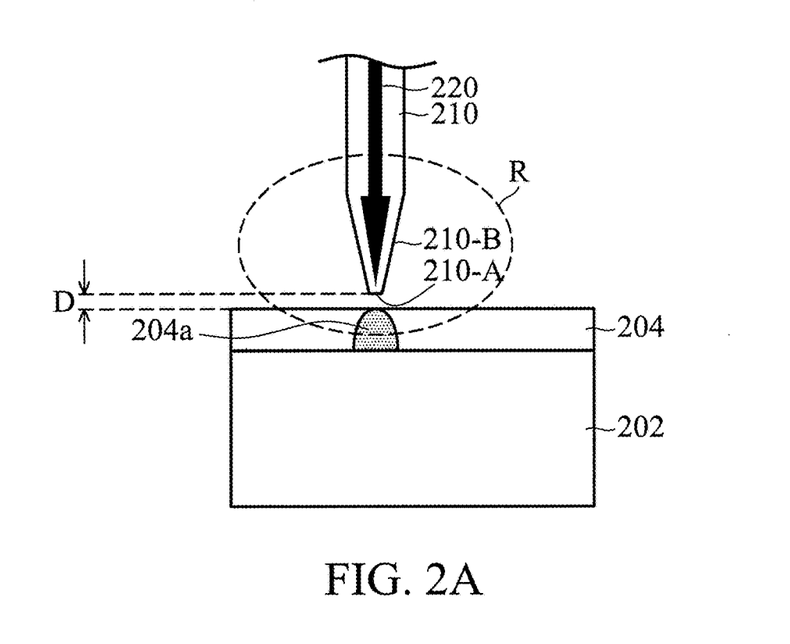
FIGS. 2A-2B show cross-sectional views of various stages of an exposure method in accordance with some embodiments.
Figure 2B:
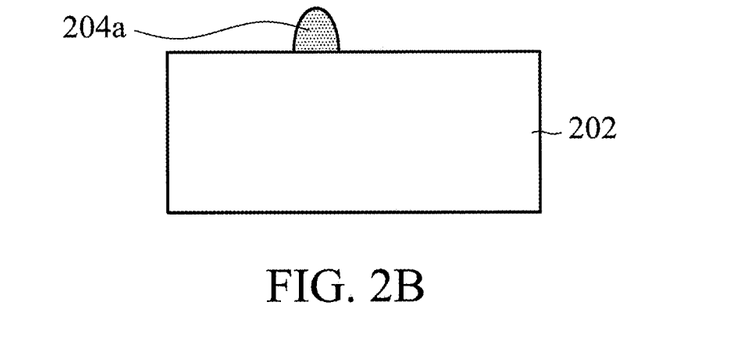

FIGS. 2A-2B show cross-sectional views of various stages of an exposure method in accordance with some embodiments. Referring to FIG. 2A, first, a layer of photo-curable material 204 is coated on the substrate 202. The substrate 202 may include semiconductor substrate, glass, polymer, ceramic, metal, or a combination thereof. The photo-curable material 204 may be polymer material having fluidity, and it can be uniformly coated on the substrate 202 to form a thin film. When the photo-curable material 204 is irradiated (exposed) to light having a specific wavelength, the polymer may undergo a crosslinking reaction and may be cured. The photo-curable material 204 has photo-curable functional groups, such as an alkenyl group, a carboxyl group, an unsaturated polyester group, an acryl group, an epoxyor group, or another suitable functional group. The photo-curable material 204 may use any suitable photo-curable material. In some embodiments, the photo-curable material 204 may include negative photoresist material, such as phenolic resins, polyisoprene rubber, or other negative photoresist materials. In some embodiments, the photo-curable material 204 may include epoxy resin, acrylic resin, or another suitable photo-curable polymer.

Still referring to FIG. 2A, the light source 220 is then transmitted to the surface of the photo-curable material 204 via the optical fiber 210. A portion of the photo-curable material 204 is exposed to form photo-cured material 204a. Referring to FIG. 2B, after forming the photo-cured material 204a, the photo-curable material 204 which is not exposed by the light source 220 is then removed. It should be realized that the size of the photo-cured material 204a depends on the light output area of the light output end 210-A. If the light output area is smaller, the size of the photo-cured material 204a may also be smaller. In this disclosure, by forming the cone portion 210-B at one end of the optical fiber 210, the light output area of the light output end 210-A is significantly reduced. Therefore, the critical dimensions of the resulting 3-dimensional structure may be effectively reduced.

Figure 6A:
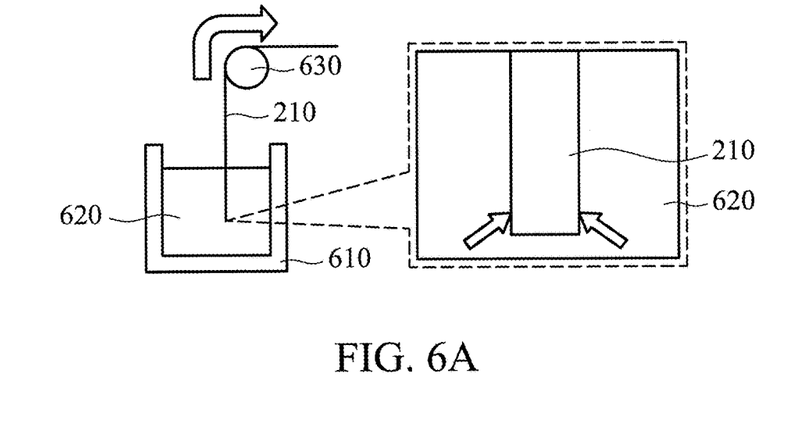
FIGS. 6A-6B show cross-sectional views of various stages of forming an optical fiber including a cone portion in accordance with other embodiments.
Figure 6B:
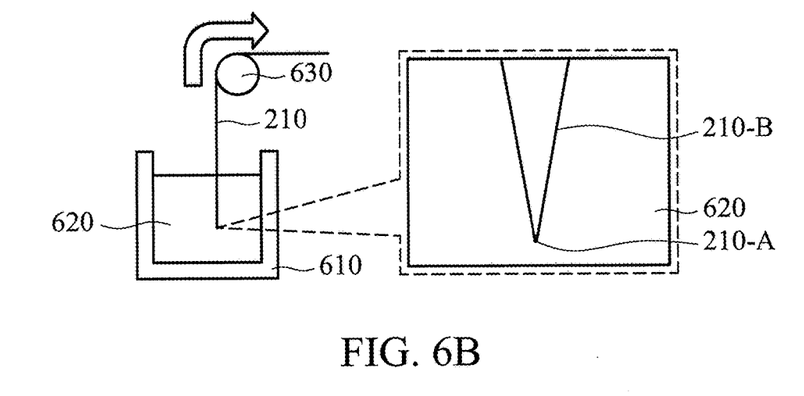

FIGS. 6A-6B show cross-sectional views of various stages of forming an optical fiber 210 including a cone portion in accordance with other embodiments. In FIGS. 6A-6B, the region surrounded by the dotted line shows the schematic enlarged cross-sectional profile of the tip of the optical fiber 210 in the etching solution 620. Referring to FIG. 6A, first, the etching tank 610 is filled with the etching solution 620, and a portion of the optical fiber 210 is immersed into the etching solution 620. Then, the optical fiber 210 is slowly and gradually pulled out from the etching solution 620 by the controller 630, as shown in FIG. 6B. If the portion of the optical fiber 210 is closer to the end, its duration of being immersed in the etching solution 620 will be longer. Therefore, the amount of optical fiber 210 removed may be more in the etching step. As a result, the optical fiber 210 including the cone portion 210-B may be formed.

The optical fiber 210 may use the material of a conventional optical fiber. In some embodiments, the optical fiber 210 may comprise quartz glass. The etching solution 620 may be acidic solution, basic solution, or other suitable solution. The etching solution 620 may be appropriately chosen according to the material of the optical fiber 210. For example, in some embodiments, the material of the optical fiber 210 is quartz glass, and the etching solution 620 may be hydrofluoric acid.

The controller 630 is configured to control the pulling speed of the optical fiber 210 which is pulled out from the etching solution 620. By controlling the pulling speed of the optical fiber 210, the cross-sectional profile of the cone portion 210-B and the light output area of the light output end 210-A may be varied. For example, if the pulling speed is slower, the light output area of the light output end 210-A may be smaller. The controller 630 may comprise a stepper motor.

As shown in FIG. 6B, the light output area of the light output end 210-A of the optical fiber 210 may be significantly reduced by immersing the optical fiber 210 into the etching solution 620. In some embodiments, the light output area of the light output end 210-A is in a range of $10$-$10^6$ $nm^2$. In some embodiments, the light output area of the light output end 210-A is in a range of $10$-$10^5$ $nm^2$. In some embodiments, the light output area of the light output end 210-A is in a range of $10$-$10^4$ $nm^2$. Because the light output area of the light output end 210-A is reduced, the resolution of the exposure process is improved. Therefore, the critical dimensions of the resulting 3-dimensional structure may also be effectively reduced.

In this embodiment, the optical fiber 210 is cylindrical and etched by an isotropic etching process. Thus, the light output end 210-A of the resulting optical fiber 210 has a substantially round sectional shape when it is observed from a direction that is parallel to the length of the optical fiber 210. However, the disclosure may not be limited. The light output end 210-A may have another sectional shape, for example it may be rectangular, oval, or irregular polygonal, when it is observed from a direction that is parallel to the length of the optical fiber 210. In order to change the sectional shape of the light output end 210-A, an optical fiber 210 having another sectional shape (e.g., rectangular) may be used, or the optical fiber 210 may be etched by another etching method (e.g., dry etching). Furthermore, the cone portion 210-B may be formed by mechanical polishing or molding.

The inventors of this disclosure discovered that the cross-sectional profile of the cone portion 210-B, the material of the photo-curable material, and the distance between the optical fiber and the photo-curable material may affect the exposure step. The details of these parameters will be discussed in the following paragraphs.

Figure 3:
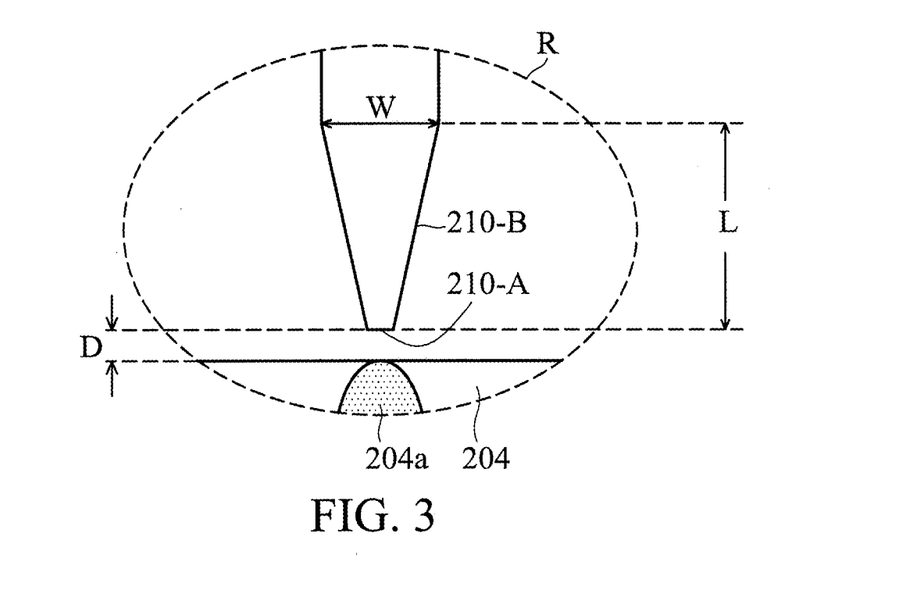
FIG. 3 shows an enlarged cross-sectional view of the region R of FIG. 2A.

FIG. 3 shows an enlarged cross-sectional view of the region R of FIG. 2A. Referring to FIG. 3, the cross-sectional profile of the cone portion 210-B has a length L and a width W. The ratio L/W of the length L to the width W may be controlled within a specific range. In some embodiments, the ratio L/W of the length L to the width W is 5-20. If the ratio L/W is too small, the photo-curable material cannot be effectively cured due to the remarkable loss of the light source at the cone portion. Furthermore, if the ratio L/W is too small, it is difficult to control the immersion time of the optical fiber 210 because the length L of the portion immersed in the etching solution 620 is too short. If the immersion time is too short, the amount of optical fiber 210 removed by etching may be too little. As a result, the light output area of the light output end 210-A cannot be significantly reduced. Conversely, if the immersion time is too long, the amount of optical fiber 210 removed by etching may be too great. Therefore, the width of the cone portion 210-B may taper sharply, rather than tapering gradually. As a result, the optical fiber may break. However, if the ratio L/W is too large, the length L of the cone portion 210-B may be too long. As a result, it is difficult to control the motions of the optical fiber by the control module, and the optical fiber may bend or curve in the duration of its motion.

Still referring to FIG. 3, according to the wavelength of the exposing light source, the length L of the cone portion 210-B may be controlled within a specific range. In some embodiments, the exposing light source has a wavelength $\lambda$, and the ratio L/$\lambda$ of the length L to the wavelength $\lambda$ may be greater than 10. It may be noted that the ability of condensing the exposing light source of the optical fiber 210 may be significantly reduced due to the sharply varied cross-sectional profile of the optical fiber 210. Therefore, by controlling the ratio L/$\lambda$ greater than 10, the ability for condensing the exposing light source of the optical fiber 210 may not be affected by the variation of the cross-sectional profile of the optical fiber 210, and therefore, the stability of the exposure process is improved.

When selecting the photo-curable material, consideration must be given not only to matching the photo-curable material and the exposing light source, but also to the ratio of the refractive index of the optical fiber to the refractive index of the photo-curable material. If an exposing light source with mismatching energy is used, the photo-curable material cannot be cured completely, or its curing rate may be too low. As a result, the energy consumption and the production cost may be increased, and the yield of the product may be reduced. Accordingly, the photo-curable material may be appropriately chosen based on the exposing light source, or the exposing light source may be appropriately chosen based on the photo-curable material. In some embodiments, the photo-curable material may be polymer material having photo-curable functional groups, such as an unsaturated polyester group, an acryl group, or an epoxy, and the exposing light source may be UV light having a wavelength in a range of 100-400 nm. Furthermore, in order to transmit light from the optical fiber into the photo-curable material, the refractive index of the photo-curable material and the refractive index of the optical fiber may be as close as possible. If the refractive index of the photo-curable material is too low, light may be totally reflected at the interface between the optical fiber and the photo-curable material. Therefore, the light cannot penetrate into the photo-curable material. In some embodiments, the optical fiber has a refractive index n1, the photo-curable material has a refractive index n2, and the ratio n1/n2 is in a range of 0.9-1.1. In other embodiments, the refractive index n1 of the optical fiber may be substantially equal to the refractive index n2 of the photo-curable material.

Still referring to FIG. 3, the optical fiber 210 and the photo-curable material 204 are spaced a distance D apart during the exposure step. In this disclosure, the distance D may also be referred to as the shortest distance between the optical fiber and the photo-curable material. The distance D may be controlled within a specific range. In some embodiments, the distance D between the optical fiber and the photo-curable material is in a range of 0.1-100 nm. In other embodiments, the distance D between the optical fiber and the photo-curable material is in a range of 0.1-1 nm. If the distance D is too short, the optical fiber may directly contact the photo-curable material. Thus, the uncured photo-curable material may be attached to the surface of the optical fiber, and then cure. Therefore, the life time of the optical fiber may be shortened, and the surface of the photo-curable material may be scratched by the optical fiber. As a result, the yield of the product may be reduced, and the production cost may be increased. Conversely, if the distance D is too great, the light output efficiency of the optical fiber is reduced. As a result, the duration of the exposure step may be lengthened, and therefore, productivity may be reduced. Furthermore, if the distance D is too great, the focusing effect of the light output from the optical fiber may degrade. Therefore, the critical dimensions of the resulting 3-dimensional structure may be increased, and it is disadvantageous for the minimization of the critical dimensions.

Since surface roughness of the photo-curable material or the surface roughness of the underlying substrate may not be uniform, the distance D between the optical fiber and the photo-curable material may vary, and the uniformity of the exposure process may be affected. Accordingly, in some embodiments of this disclosure, the motion of the optical fiber in the Z-axis may be dynamically fine-tuned by the control module, such that the optical fiber may be apart from the photo-curable material by a constant distance. Therefore, the uniformity of the exposure process in different regions may be improved. As described above, the control module may use a control module having the fine-tuning ability in the vertical direction, such as the AFM control module.

Figure 4A:
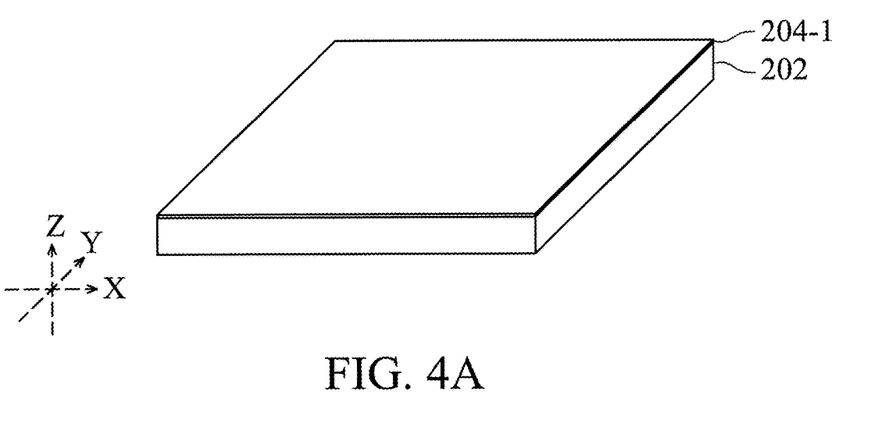
FIGS. 4A-4E show cross-sectional views of various stages of an exposure method in accordance with some embodiments.
Figure 4B:
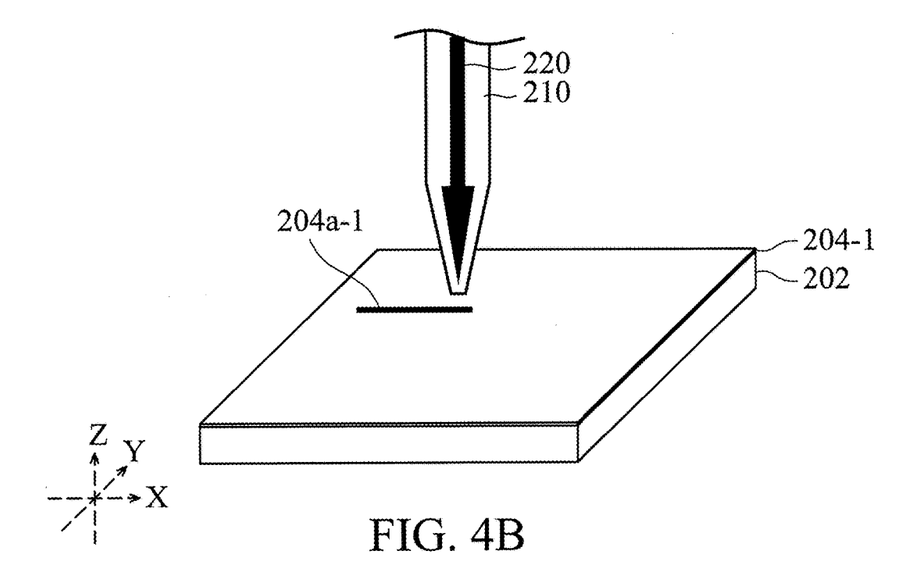

An exposure method is also provided in this disclosure. FIGS. 4A-4E show cross-sectional views of various stages of an exposure method in accordance with some embodiments. Referring to FIG. 4A, first, photo-curable material 204-1 is coated on the substrate 202. The material of the substrate 202 and the photo-curable material 204-1 has been described above, and the details will not be repeated here. The photo-curable material 204-1 may be coated using a suitable method, such as spin coating, immersion coating, spray coating, printing, or the like. Then, as shown in FIG. 4B, light source 220 is transmitted to the surface of the photo-curable material 204-1 by the optical fiber 210. At least a portion of the surface of the photo-curable material 204-1 is exposed to form photo-cured material 204a-1.

Figure 4C:
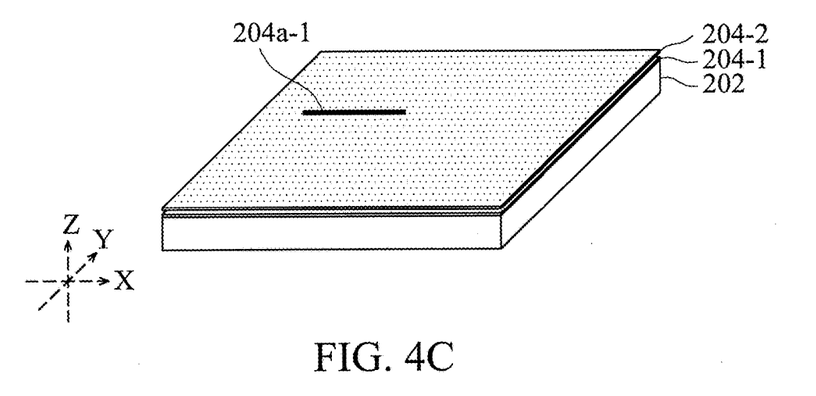
Figure 4D:
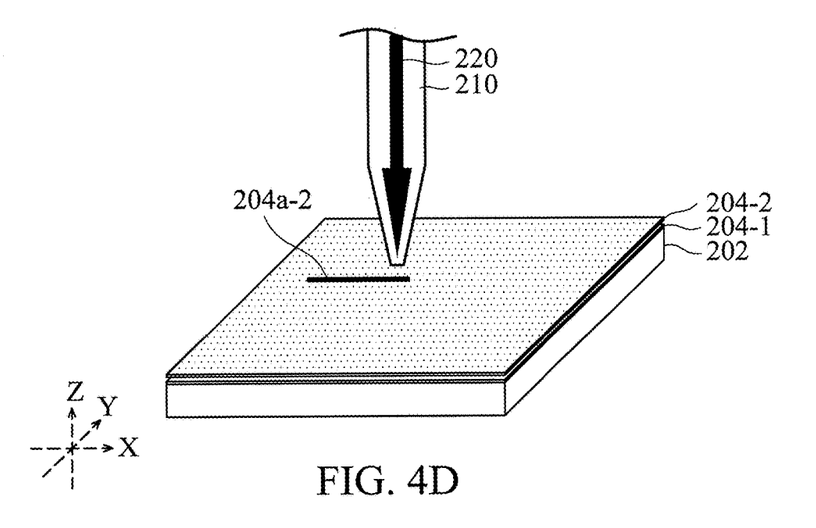

Referring to FIG. 4C, photo-curable material 204-2 is coated on the photo-curable material 204-1. Then, referring to FIG. 4D, a light source 220 is transmitted to the surface of the photo-curable material 204-2 via the optical fiber 210. At least a portion of the surface of the photo-curable material 204-2 is exposed to form photo-cured material 204a-2. The material and the coating method of the photo-curable material 204-2 may be the same as or similar to those of the photo-curable material 204-1, and the details will not be repeated here. In some embodiments, the photo-curable material 204-2 may be the same as the photo-curable material 204-1. In other embodiments, the photo-curable material 204-2 may be different from the photo-curable material 204-1, and therefore, the optical fiber 210 and the light source 220 used for exposing the photo-curable material 204-2 may be optionally changed.

In some embodiments, the steps described in FIGS. 4A-4B may be repeated many times to obtain the desired 3-dimensional structure. In other embodiments, when the photo-curable material 204-2 is different from the photo-curable material 204-1, according to the desired 3-dimensional structure, the steps described in FIGS. 4A-4B and the steps described in FIGS. 4C-4D may be independently repeated many times. As a result, the photo-cured material 204a-1 and the photo-cured material 204a-2 in the resulting 3-dimensional structure may independently have the desired thickness. The thickness is measured along the direction that is perpendicular to the top surface of the substrate (i.e., the direction of the Z-axis). Therefore, in this disclosure, the thickness may also be referred to as the height. The height of the photo-cured material 204a-1 and the photo-cured material 204a-2 may be at the micrometer level or above. In some embodiments, the height of the photo-cured material 204a-1 and the photo-cured material 204a-2 may be in a range of 10-1000 µm.

It should be noted that the embodiments disclosed in this disclosure are merely examples and is not intended to be limiting. One skilled in the art may realize that, according to the desired 3-dimensional structure, the photo-curable material may comprise three or more kinds of photo-curable material, and the number of iterations of the exposure steps of each photo-curable material may respectively depend on its desired height.

Figure 4E:
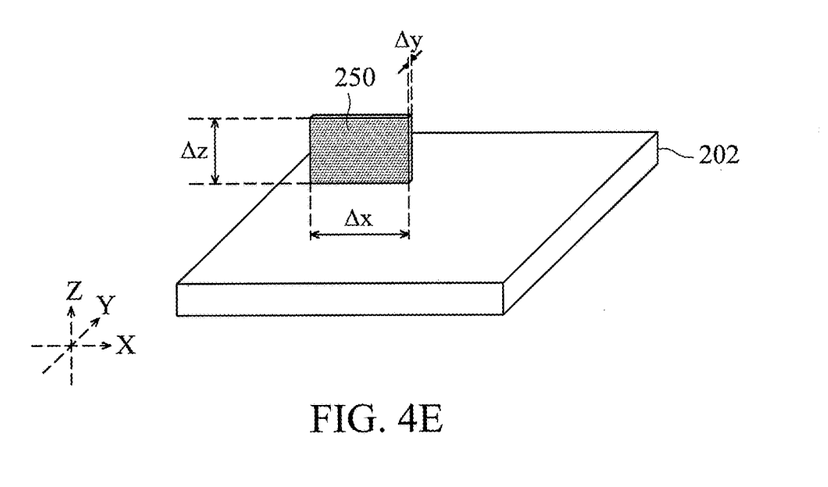

Referring to FIG. 4E, after all the exposure steps are completed, the photo-curable material 204-1 and the photo-curable material 204-2 which is not exposed by the light source 220 is removed, and the photo-cured material 204a-1 and the photo-cured material 204a-2 remains to form the 3-dimensional structure 250. The photo-curable material 204-1 and the photo-curable material 204-2 may be removed by a suitable method, such as plasma ashing or cleaning by developer. In this embodiment, in order to reduce the duration of the process, the step of removing the photo-curable material is performed after all the exposure steps are completed. However, the steps of removing the photo-curable material may be performed in any order or may optionally be repeated any number of times. For example, in some embodiments, the step of removing the photo-curable material may be performed once after each exposure step is completed.

Referring to FIG. 4E, the sizes of the 3-dimensional structure 250 in the X direction, Y direction, and Z direction are Δx, Δy, and Δz, respectively. The achievable minimum values of Δx, Δy, and Δz are defined as the critical dimensions of the 3-dimensional structure 250 in the X direction, Y direction, and Z direction, respectively. It should be realized that the critical dimension of the 3-dimensional structure 250 in the X direction, Y direction, and Z direction may respectively depend on the shortest moving distance of the optical fiber 210 in the X direction, Y direction, and Z direction (i.e., the control accuracy of the control module in the X direction, Y direction, and Z direction). As described above, in some embodiments, when the motion of the optical fiber 210 is controlled by the AFM control module, the shortest moving distances of the optical fiber 210 in the X direction, Y direction, and Z direction may be at nanometer level, and therefore, the critical dimensions of the 3-dimensional structure may be significantly reduced. In some embodiments, the critical dimensions Δx, Δy, and Δz of the 3-dimensional structure 250 in the X direction, Y direction, and Z direction may independently be in a range of 1-100 nm.

Figure 5A:
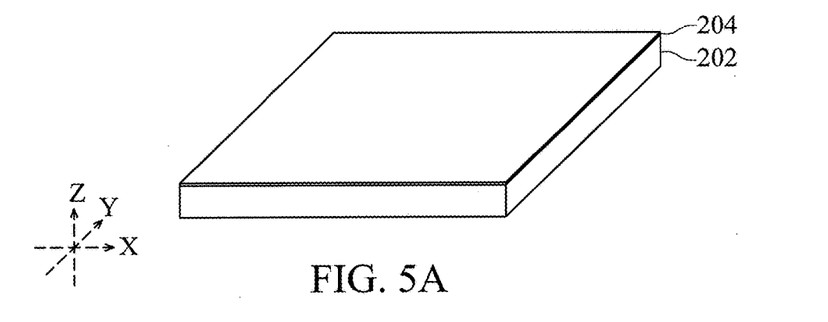
FIGS. 5A-5E show cross-sectional views of various stages of an exposure method in accordance with other embodiments.
Figure 5B:
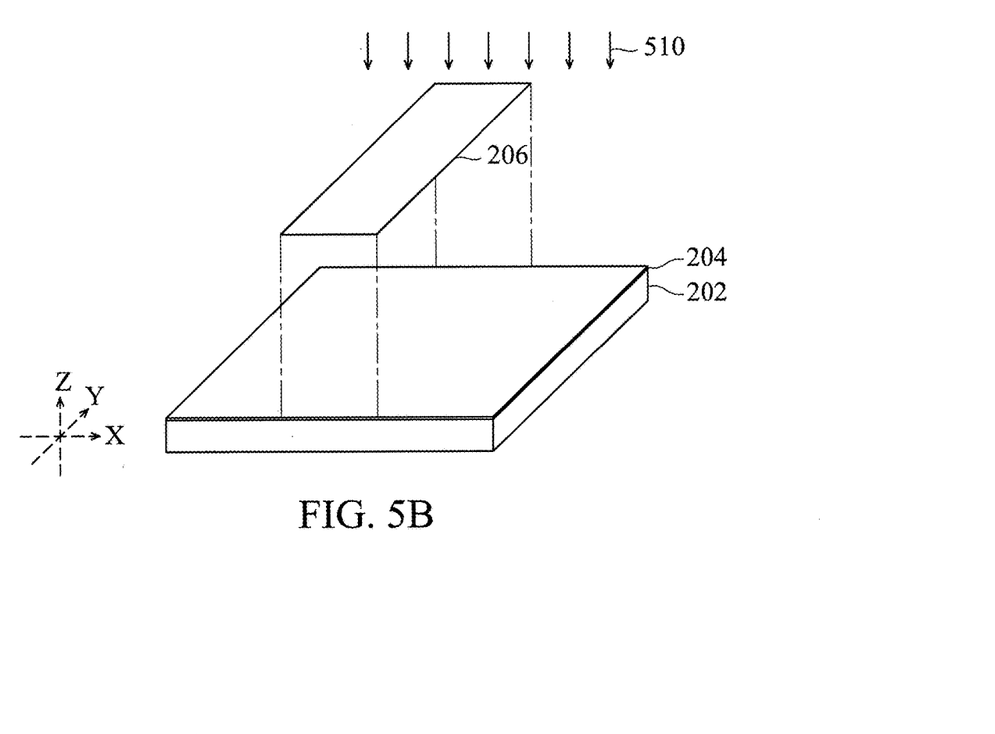
Figure 5C:
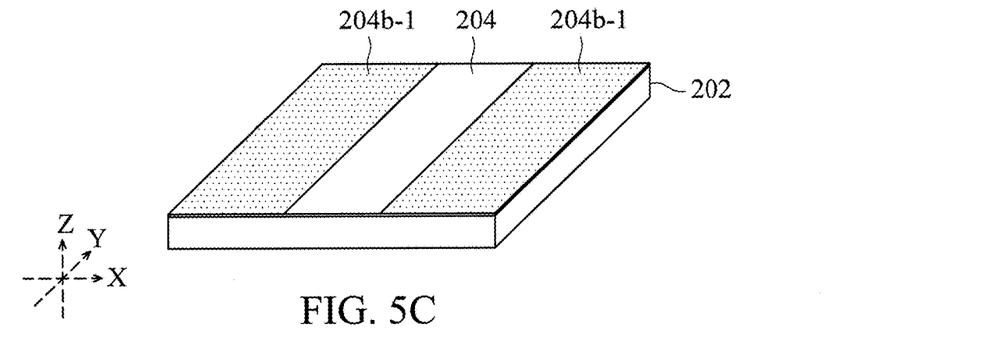
Figure 5D:
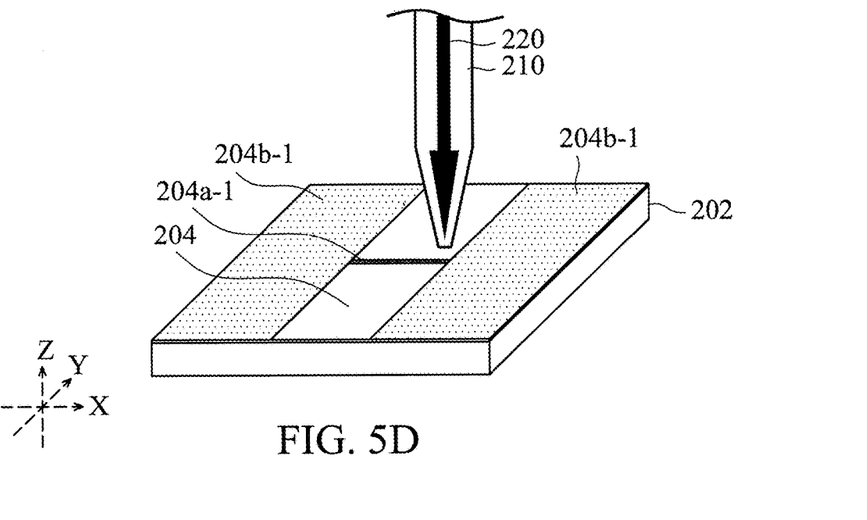

FIGS. 5A-5E show cross-sectional views of various stages of an exposure method in accordance with other embodiments. For the purpose of simplicity and clarity, these components shown in FIGS. 5A-5E and their formation method may be the same as or similar to those shown in FIGS. 4A-4E and the details will not be repeated here. Referring to FIG. 5A, photo-curable material 204 is coated on the substrate 202. Then, referring to FIG. 5B, a photomask 206 is provided as a mask for exposing. A portion of the surface of the photo-curable material 204 is exposed by the light source 510 to form the photo-cured material 204b-1, as shown in FIG. 5C. After the photo-cured material 204b-1 is formed, the photomask 206 is removed. Then, referring to FIG. 5D, the steps described above are performed after the photomask 206 is removed. The remaining portion (i.e., the portion which is shielded by the photomask 206 or the portion which is not exposed by the light source 510) of the photo-curable material 204 is exposed by using the optical fiber 210 and the light source 220, and the photo-cured material 204a-1 is formed.

Figure 5E:
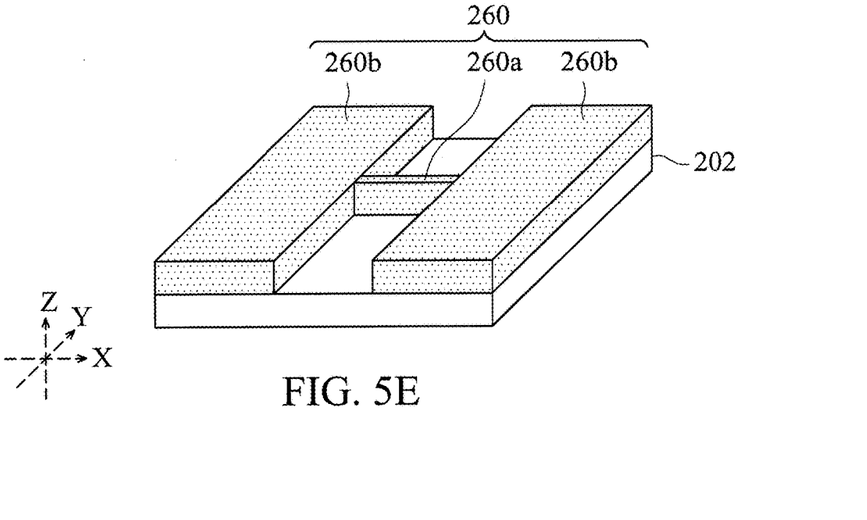

Referring to FIG. 5E, the steps described in FIGS. 5A-5D may be repeated many times to complete the 3-dimensional structure 260. The 3-dimensional structure 260 may comprise the first portion 260a and the second portion 260b. The first portion 260a is cured by using the optical fiber 210 and the light source 220, and therefore, it has smaller critical dimensions. The second portion 260b is cured in a larger area by using the light source 510, and therefore, its critical dimensions are much larger than the critical dimensions of the first portion 260a. It should be noted that, in this embodiment, the exposure step in a large area by using the photomask 206 and the light source 510 is performed first, and then the portion not cured by the light source 510 is exposed in a small area by using the optical fiber 210 and the light source 220. In other embodiments, the exposure step in a small area by using the optical fiber 210 and the light source 220 may be performed first, and then the exposure step in a large area by using the photomask 206 and the light source 510 may be performed as required.

The embodiment shown in FIGS. 5A-5E is a two-step exposure method, and two light sources having the same wavelength and different light output areas may be used in this method. Because the light source having an extremely small light output area is used to perform the exposure step and the curing step in an extremely small area, the critical dimensions of the 3-dimensional structure may be reduced. On the other hand, because the light source having a larger light output area is used to perform the exposure step and the curing step in a large area, the duration of the process may be significantly reduced and the productivity may be improved. Accordingly, the 3-dimensional structure with high complexity and high precision may be rapidly produced by using the method described in this embodiment.

As described above, exposure equipment is provided in this disclosure. The exposure equipment comprises an optical fiber having a cone portion, and therefore, the light output area and the critical dimensions of the 3-dimensional structure may be significantly reduced. Furthermore, the exposure equipment may control the motion of the optical fiber in the X direction, Y direction, and Z direction. Therefore, the critical dimensions of the 3-dimensional structure in the X direction, Y direction, and Z direction may be reduced, and the uniformity of the exposure process in different regions may be improved. In addition, an exposure method is also provided in this disclosure. In some embodiments, the exposure step and the curing step are performed using an optical fiber having a cone portion, and therefore, the critical dimensions of the resulting 3-dimensional structure may be significantly reduced. In other embodiments, a two-step exposure method is also provided in this disclosure. In the two-step exposure method, the exposure step and the curing step are performed by using two light sources having the same wavelength and different light output area, and therefore, the 3-dimensional structure with high complexity and high precision may be rapidly produced.

Although the disclosure has been described by way of example and in terms of the preferred embodiments, it should be understood that various modifications and similar arrangements (as would be apparent to those skilled in the art) can be made herein without departing from the spirit and scope of the disclosure as defined by the appended claims.

What is claimed is:

1. An exposure method, comprising:
   coating a photo-curable material on a substrate;
   exposing a first portion of the photo-curable material by providing a first light source through an optical fiber to form a first photo-cured material, wherein the optical fiber comprises a light output end and a cone portion that tapers toward the light output end, wherein a cross-sectional profile of the cone portion of the optical fiber has a length L and a width W, and a ratio L/W of the length L to the width W is 5-20; and
   removing a second portion of photo-curable material that is not exposed by the first light source while leaving the first photo-cured material.

2. The exposure method as claimed in claim 1, wherein the light output end has a light output area in a range of $10\text{-}10^6$ nm$^2$.

3. The exposure method as claimed in claim 1, wherein the first light source has a wavelength $\lambda$, and a ratio L/$\lambda$ of the length L to the wavelength $\lambda$ is greater than 10.

4. The exposure method as claimed in claim 1, wherein the optical fiber has a first refractive index n1, and the photo-curable material has a second refractive index n2, and wherein a ratio n1/n2 of the first refractive index n1 to the second refractive index n2 is in a range of 0.9-1.1.

5. The exposure method as claimed in claim 1, wherein during the exposure of the photo-curable material, a shortest distance between the optical fiber and the photo-curable material is in a range of 0.1-100 nm.

6. The exposure method as claimed in claim 1, further comprising repeating the steps of coating, exposing, and removing at least once to form a 3-dimensional structure.

7. The exposure method as claimed in claim 1, before the exposure by providing the first light source, further comprising:
   forming a patterned photomask layer on the photo-curable material;
   exposing a portion of the photo-curable material which is not covered by the patterned photomask layer by providing a second light source to form a second photo-cured material; and
   removing the patterned photomask layer, wherein the exposure by providing the first light source is performed on a portion of the photo-curable material other than the portion exposed by the second light source.

8. An exposure equipment, comprising:
   a carrier platform for placing photo-curable material;
   a light source module comprising an optical fiber, wherein the optical fiber comprises a light output end and a cone portion that tapers toward the light output end, and the optical fiber is configured to provide a light source for performing an exposure step on the photo-curable material, wherein a cross-sectional profile of the cone portion of the optical fiber has a length L and a width W, and a ratio L/W of the length L to the width W is 5-20; and
   a control module for controlling a motion of the optical fiber.

9. The exposure equipment as claimed in claim 8, wherein the light output end has a light output area in a range of $10\text{-}10^6$ nm$^2$.

10. The exposure equipment as claimed in claim 8, wherein the first light source has a wavelength $\lambda$, and a ratio L/$\lambda$ of the length L to the wavelength $\lambda$ is greater than 10.

11. The exposure equipment as claimed in claim 8, wherein a shortest moving distances of the optical fiber controlled by the control module in X direction, Y direction, and Z direction are $\Delta x$, $\Delta y$, and $\Delta z$, respectively, and wherein at least one of $\Delta x$, $\Delta y$, and $\Delta z$ is in a range of 1-100 nm.

* * * * *